(12) United States Patent
Solan (10) Patent No.: US 10,484,026 B2
(45) Date of Patent: *Nov. 19, 2019

(54) CIRCUIT ARRANGEMENT AND METHOD FOR ATTENUATION COMPENSATION IN AN ANTENNA SIGNAL LINK

(71) Applicant: Bury Sp.z.o.o., Mielec (PL)

(72) Inventor: Bülent Solan, Bielefeld (DE)

(73) Assignee: BURY SP.Z.O.O., Mielec (PL)

( * ) Notice: Subject to any disclaimer, the term of this patent is extended or adjusted under 35 U.S.C. 154(b) by 0 days.

This patent is subject to a terminal disclaimer.

(21) Appl. No.: 16/015,635

(22) Filed: Jun. 22, 2018

(65) Prior Publication Data

US 2018/0302110 A1    Oct. 18, 2018

Related U.S. Application Data

(63) Continuation of application No. 15/585,230, filed on May 3, 2017, now Pat. No. 10,122,393.

(30) Foreign Application Priority Data

May 3, 2016    (DE) .................. 10 2016 108 206

(51) Int. Cl.
| H04B 1/04 | (2006.01) |
| H04B 1/3877 | (2015.01) |
| H04W 52/52 | (2009.01) |
| H03G 3/30 | (2006.01) |
| H04W 52/36 | (2009.01) |

(Continued)

(52) U.S. Cl.
CPC ......... *H04B 1/0475* (2013.01); *H03G 3/3036* (2013.01); *H04B 1/3877* (2013.01); *H04W 52/367* (2013.01); *H04W 52/52* (2013.01); *H03G 2201/106* (2013.01); *H04B 1/0458* (2013.01); *H04B 1/163* (2013.01);
(Continued)

(58) Field of Classification Search
CPC . H04B 1/0475; H04B 1/3877; H04W 52/367; H04W 52/52; H03G 3/3036
USPC ........................................... 455/127.2
See application file for complete search history.

(56) References Cited

U.S. PATENT DOCUMENTS

| 6,707,805 B2* | 3/2004 | Ozluturk ............... H04B 1/707 370/335 |
| 6,819,938 B2* | 11/2004 | Sahota .................. H04B 17/13 455/127.1 |

(Continued)

*Primary Examiner* — Sonny Trinh
(74) *Attorney, Agent, or Firm* — W & C IP (57) ABSTRACT

A circuit arrangement for compensating for an attenuation occurring in an antenna signal link between a mobile radio terminal and an antenna has at least one antenna signal amplifier in the antenna signal link and a control unit for adjusting a gain factor. The antenna signal conducted through an associated antenna signal amplifier is amplified or attenuated. The circuit arrangement has a detection unit for detecting an antenna signal power ($P_M$, $P_A$) of the antenna signal in the signal path of the antenna signal link. The control unit is configured for changing the gain factor, detecting a change, changing the transmit power ($P_M$) of the mobile radio terminal, and adapting the gain factor to the coupling attenuation of the antenna signal link in dependence on a detected response of the mobile radio terminal.

21 Claims, 4 Drawing Sheets

(51) Int. Cl.
  *H04B 1/16* (2006.01)
  *H04B 1/18* (2006.01)
  *H04B 1/3822* (2015.01)
  *H04W 52/08* (2009.01)

(52) U.S. Cl.
  CPC .............. *H04B 1/18* (2013.01); *H04B 1/3822* (2013.01); *H04B 2001/0416* (2013.01); *H04W 52/08* (2013.01)

(56) References Cited

U.S. PATENT DOCUMENTS

| | | | |
|---|---|---|---|
| 7,076,266 B2 * | 7/2006 | Sahota | H04W 52/52 375/219 |
| 2003/0100351 A1 * | 5/2003 | Friesen | H04B 1/3877 455/571 |
| 2008/0200199 A1 * | 8/2008 | Runze | H04W 52/52 455/522 |

* cited by examiner

CIRCUIT ARRANGEMENT AND METHOD FOR ATTENUATION COMPENSATION IN AN ANTENNA SIGNAL LINK

CROSS-REFERENCE TO RELATED APPLICATIONS

This application is a continuation application of U.S. Ser. No. 15/585,230, filed May 3, 2017, now U.S. Pat. No. 10,122,393, and which claimed priority to German Patent Application 10 2016 108 206.6 filed May 3, 2016.

FIELD OF THE INVENTION

The invention relates to a circuit arrangement for compensating for an attenuation occurring in an antenna signal link between a mobile radio terminal and an antenna comprising at least one antenna signal amplifier in the antenna signal link and with a control unit for adjusting a gain factor, by which the antenna signal conducted through an associated antenna signal amplifier is amplified or attenuated, wherein the circuit arrangement has at least one detection unit for detecting an antenna signal power of the antenna signal in the signal path of the antenna signal link.

The invention also relates to a method for compensating for an attenuation occurring in an antenna signal link between a mobile radio terminal and an antenna with the aid of at least one signal amplifier in the antenna signal link, having the step of detecting an antenna signal power of the antenna signal in the signal path of the antenna signal link.

BACKGROUND

When a mobile radio terminal is connected to an external antenna as takes place, e.g. with hands-free facilities in motor vehicles, attenuation occurs on the signal path from the mobile radio terminal to the antenna and conversely. Although the quality of transmission and reception is to be improved by the external antenna, the attenuation has the effect that the maximum possible signal quality is not achieved.

In practice, the attenuation is approximately constant in the case of a cable-connected linking of the mobile radio terminal to the antenna and enables a compensation circuit having a constant gain factor to be operated. In the case of an electromagnetic capacitive or inductive coupling of the mobile radio terminal to the antenna signal amplifier and the antenna connected thereto, however, the attenuation can vary in dependence on the current operating state and the mobile radio terminal used. A predetermined constant gain factor is then not optimal for compensating for the instantaneous attenuation.

DE 10 2013 101 590 A1 describes a circuit arrangement for compensating for coupling attenuation in an antenna signal link in which a gain factor is adapted at a rate of change which is slower compared with the normal speed of an antenna signal power control loop between a connected mobile radio terminal and a base station of a mobile radio network. Due to the power control on the network side, however, the signal power of the mobile radio terminal is, in any case, first adapted to the present total attenuation between mobile radio terminal and base station so that the mobile radio terminals transmit with the minimal possible (optimal) power. This power control on the network side is supported by an additional adaptation of the gain factor for a predetermined limit range.

SUMMARY

On the basis of this, it is the object of the present invention to create an improved circuit arrangement for compensating for an attenuation occurring in an antenna signal link between a mobile radio terminal and an antenna and a compensation method therefor by means of which an adjustment of the gain factor, adapted to the operating state, of the at least one antenna signal amplifier takes place in a simple manner without access to information of the mobile radio terminal and without elaborate surveying of the coupling attenuation actually currently present.

The object is achieved by the circuit arrangement having the features of claim 1 and by the compensation method having the features of claim 11. Advantageous embodiments are described in the subclaims.

It Is proposed that the control unit of the circuit arrangement is configured for changing the gain factor, for detecting a change in the antenna signal power following as response thereto by changing the transmitting power of the mobile radio terminal, i.e. by the change in the antenna signal power through a power control of the mobile radio terminal then starting effectively, and for adapting the gain factor to the coupling attenuation of the antenna signal link in dependence on a detected response of the mobile radio terminal.

Thus, for example, there is no need for adapting the gain factor when the transmit signal power of the mobile radio terminal responds to a change in the gain factor performed by way of a test and, as a result, the antenna signal power of the compensator thus remains unchanged. This is then an indication that the power control on the network side can perform the compensation of the coupling attenuation and thus there is a good reception.

If, in contrast, the transmit signal power of the mobile radio terminal does not change with a change in the gain factor, then the power control on the network side of the mobile radio terminal by the base station connected thereto is no longer effective. This means that the mobile telephone has reached its maximum transmitting power. This applies, in particular, if the mobile radio terminal is sending with the maximum transmit power. The detected antenna signal power will then change, however, in accordance with the change of the gain factor since it is no longer influenced by a response of the power control of the mobile radio terminal. The lack of a response of the mobile radio terminal thus leads to a detectable response of the antenna signal power of the antenna signal, particularly of the output signal power of the circuit arrangement which is detected by the detection unit. If such a response is detected, this then enables the gain factor to be adapted in such a manner that a compensation of the coupling attenuation takes place. In this context it is necessary, e.g., to compensate for a difference between the predetermined maximum antenna signal power and the antenna signal power which has been detected before the change in the gain factor, by correspondingly changing the gain factor.

In this context, the control unit can be configured for a further increase in the gain factor if, by detecting the antenna signal power, no change of the transmit signal power of the mobile radio terminal as response to a test-wise increase in the gain factor is detected. By this means, the transmit signal power of the mobile radio terminal is evaluated. In this state, the precise coupling attenuation is then calculated and the missing gain is set so that the coupling attenuation is compensated for, as a result of which the output power of the circuit arrangement thus corresponds to the output power of the mobile radio terminal. Optionally, however, it is also possible to increase the gain factor incrementally without calculation (possibly by an estimate) of the coupling attenuation to such an extent until the maximum output power is achieved (slow approach). This is the case when the output signal power of the circuit arrangement approaches the transmit signal power of the mobile radio terminal remaining the same with the increase in the gain factor.

The control unit can be configured for adjusting a predetermined minimum gain factor if the detected antenna signal power is less than a predetermined threshold value. By this means, an operation with the predetermined minimum gain factor is performed within a range determined by the predetermined threshold value, at which gain factor the power control on the network side is adequate for compensating for coupling attenuations in the antenna signal path. It is only when the detected antenna signal power such as, for example, the output signal power of the compensation circuit arrangement and particularly the output signal power of the antenna signal of the antenna signal amplifier conducted to the antenna corresponds to the threshold value or exceeds it that it is decided, e.g. by test-wise changing of the gain factor by means of the resultant response either due to a starting power control of the mobile radio terminal or by absence of the power control of the mobile radio terminal whether and to what extent there is an adaptation of the gain factor. In the case where the power control on the network side can no longer become effective since the mobile radio terminal has reached its maximum possible transmit signal power, the detected transmit signal power remains constant in spite of adaptation of the gain factor. This then makes it possible to infer the actually existing coupling attenuation in the antenna signal path on the basis of the detected antenna signal power.

In principle, the gain factor can be adjusted to the predetermined minimum gain factor $V_{min}$ under the following criteria which are selectable separately or in combination:
a) generally on detection of a change in the transmit signal power;
b) if the detected antenna signal power is less than a predetermined threshold value, particularly before the first determination of the optimum gain factor $V_{opt}$;
c) if the detected antenna signal power is less than a predetermined second threshold value after the first determination of the optimum gain factor $V_{opt}$.

The control unit can be configured for evaluating the form of the antenna signal power resulting in response to a sequence of changes of the gain factor performed in tests. If then the gain factor is increased or decreased in steps of 1 dB, for example incrementally in predetermined variables of the gain factor, this pattern can be similarly found again in the detected antenna signal by means of the antenna signal power, for example at the output of the antenna signal amplifier toward the antenna when the control of the mobile radio terminal on the network side is not effective. It is thus possible to reliably determine by means of a simple comparison of patterns whether an adaptation of the gain factor is required.

The control unit can be configured for changing the gain factor in a phase in which the detected transmit signal power of the mobile radio terminal is constant. The control unit is then configured for selecting a gain factor suitable for compensating for the difference of the antenna signal power detected during this process of the antenna signal amplifier and the transmit signal power of the mobile radio terminal. The transmit signal power of the mobile radio terminal which remains constant despite the change in the gain factor is thus utilized as measure to which then the transmit signal power at the output of the antenna signal amplifier is raised by adapting the gain factor. This difference is the gain, still lacking, of the permanently set minimum preamplification ($V_{min}$), by which the gain must be increased in order to obtain a precise compensation for the entire attenuation from the mobile radio terminal up to the vehicle antenna.

The adaptation of the gain factor necessary for compensating for the actual coupling attenuation can thus be determined very simply from the detected signal difference of the transmit signal power of the mobile radio terminal and the antenna signal power which is also reflected by the change in the antenna signal output power of the antenna signal amplifier toward the antenna as a result of the change in the gain factor. In this case, it is assumed that the mobile radio terminal is operated with maximum known transmit power.

The control unit can be configured for the detection of the antenna signal power received from the circuit arrangement via the antenna or radiated via the antenna for the incremental change of the gain factor in a phase in which the detected antenna signal power is constant, and for determining the coupling attenuation as a ratio or difference of the detected antenna signal power and a predetermined maximum antenna signal power when the incremental change of the gain factor does not lead to a change in the detected antenna signal power or the detected transmit signal power of the mobile radio terminal.

This is so because the gain still lacking in the permanently set minimum preamplification ($V_{min}$), by which the gain must be increased in order to obtain a precise compensation for the entire attenuation from the mobile radio terminal up to the vehicle antenna (i.e. the proportion of coupling attenuation still to be compensated for) corresponds to the quotient or the difference between the antenna signal power detected before the change in the gain factor in the phase in which the detected antenna signal power is constant, and the known predetermined maximum antenna signal power for the case that in spite of a change in the gain factor, particularly the enlargement of the gain factor, either the antenna signal power at the output of the antenna signal amplifier or, due to the lacking effectiveness of the power control of the mobile radio terminal, the transmit signal power of the mobile radio terminal does not change.

The circuit arrangement can have a data memory for storing the adapted gain factor and a predetermined minimum gain factor. The control unit is configured in such a way so as to read out the adapted gain factor stored in the data memory and the minimum gain factor in order to drive the antenna signal amplifier by this means. In this context, the gain factor of the antenna signal amplifier is set to the minimum gain factor read out, as a rule by the control unit, if the power control on the network side of the mobile radio terminal is operable. Otherwise, the antenna signal amplifier is driven by the adapted gain factor. This can take place at least by means of the adapted gain factor until a new adaptation of the gain factor is required.

The control unit can be configured for adjusting the antenna signal amplifier with the adapted gain factor for as long until a maximum transmit signal power of the mobile radio terminal is detected. On detection of an operation at maximum transmit signal power of the mobile radio terminal, a new adaptation of the gain factor takes place in the manner described before. For this purpose, there can then be a test-wise change of the gain factor again as, for example, a test-wise incremental increase of the gain factor and an evaluation of the resultant response.

DESCRIPTION OF THE DRAWINGS

The invention will be explained in greater detail in the text which follows by means of an illustrative embodiment, using the attached drawings, in which.

DETAILED DESCRIPTION

Figure 1:
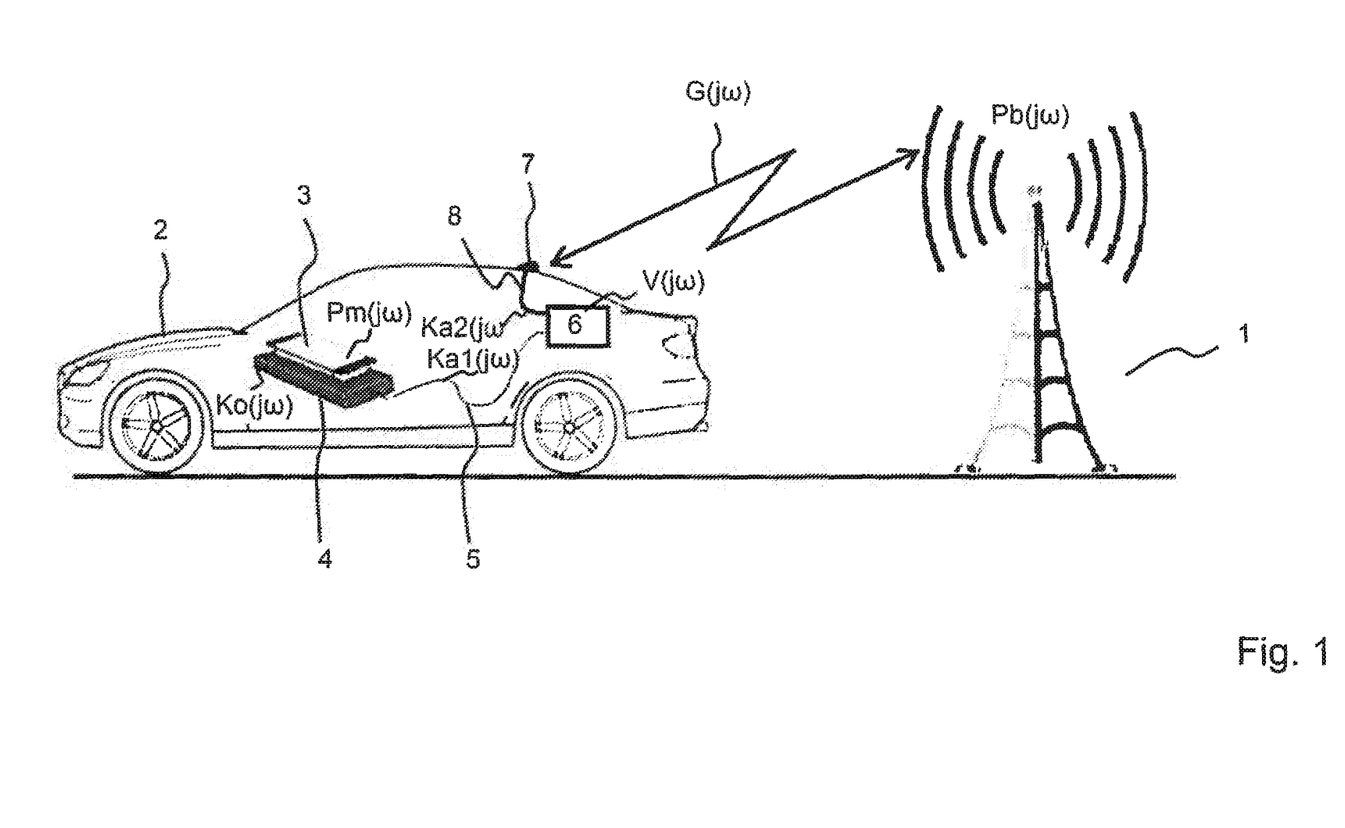
FIG. 1—shows a diagram of a radio system comprising a base station and a compensation circuit arrangement, installed in a motor vehicle between an antenna and a mobile radio terminal.

FIG. 1 shows a diagram of a mobile radio system comprising a base station 1 and a mobile radio terminal 3 operated in a motor vehicle 2. In the motor vehicle 2, a coupling shell 4 is installed for accommodating the mobile radio terminal 3 which is configured via an antenna signal link 5 to a circuit arrangement 6 for compensation of the coupling attenuation occurring in the antenna signal link 5 between mobile radio terminal 3 and an antenna 7 on the vehicle 2. For this purpose, the compensation circuit arrangement 6 has an antenna signal amplifier.

In the signal path between base station 1 and mobile radio terminal 3, the Following powers and losses occur:

The mobile radio terminal 3 initially sends an electromagnetic radio signal having the transmit power $Pm(j\omega)$. Then, coupling losses $Ko(j\omega)$ occur due to coupling between mobile radio terminal 3 and coupling shell 4. In the antenna signal link 5 between coupling shell 4 and compensation circuit arrangement 6, further cable losses $Ka1(j\omega)$ occur.

The compensation circuit arrangement 6 leads to a signal amplification $V(j\omega)$. In the antenna signal link 8 between compensation circuit arrangement 6 and antenna 7, a further cable loss $Ka2(j\omega)$ occurs.

In the signal path between antenna 7 of the motor vehicle 2 and the base station 1, there is a transmission loss $G(j\omega)$. The signal power $Pb(j\omega)$ lastly received by the base station 1 is thus determined not only by the transmit power of the mobile telephone 3 but by the intermediate losses and gains. The signal power $Pb(j\omega)$ received by the base station 1 is thus calculated as follows:

Whilst the cable losses $Ka1(j\omega)$ and $Ka2(j\omega)$ in a vehicle 2 are constant, as a rule, the losses $G(j\omega)$. $V(j\Omega)$ (controlled) and $Ko(j\omega)$ change in operation. For short times within a range of less than 1 ms, it can be assumed then that the coupling attenuation $Ko(j\omega)$ and the transmission losses $G(j\omega)$ do not change significantly and are virtually constant. The gain factor for adjusting the gain $V(j\omega)$, in contrast, is a parameter which is well controllable also within such short-time phases. If it is changed in such short times, this influences the output power of the mobile radio terminal 3 measurably due to the power control of the mobile radio terminal 3 occurring which is controlled by the base station 1. This power control on the network signal (also called Close-Loop regulation) occurs, e.g. In the case of the LTE communication standard, in a periodicity of 667 μs (1500 Hz).

It can thus be seen from FIG. 1 that when a mobile radio terminal 3 is connected to an external antenna 7 of the motor vehicle 2 as takes place, for example, in the case of hands-free facilities in motor vehicles 2, an attenuation occurs in the signal path from the mobile radio terminal 3 to the antenna 7 and conversely. Although the quality of transmission and reception are to be improved by the external antenna 7, this attenuation does not lead to the possible achievable signal quality. In the case of an electromagnetic, capacitive or inductive coupling of the mobile radio terminal 3 to the antenna signal amplifier of the compensation circuit arrangement 6 and the antenna 7 connected thereto, the attenuation can vary in dependence on the current operating state, on the mobile radio terminal 3 used (and on the position of the mobile radio terminal 3). A predetermined constant gain factor is then not optimal and cannot achieve the required compensation especially for zones having poorer conditions of reception.

The compensation circuit arrangement 6 is then configured in such a way that the coupling attenuation occurring between mobile radio terminal 3 and antenna 7 is adapted adaptively continuously via adapting the gain factor, i.e, the amplification $V(j\omega)$ without access to information of the mobile radio terminal 3, i.e. without data analysis, by means of a simple continuous antenna signal power measurement (level detection) and an initialization sequence to the coupling attenuation currently actually present in the antenna signal link, and thus an operating state.

Figure 2:
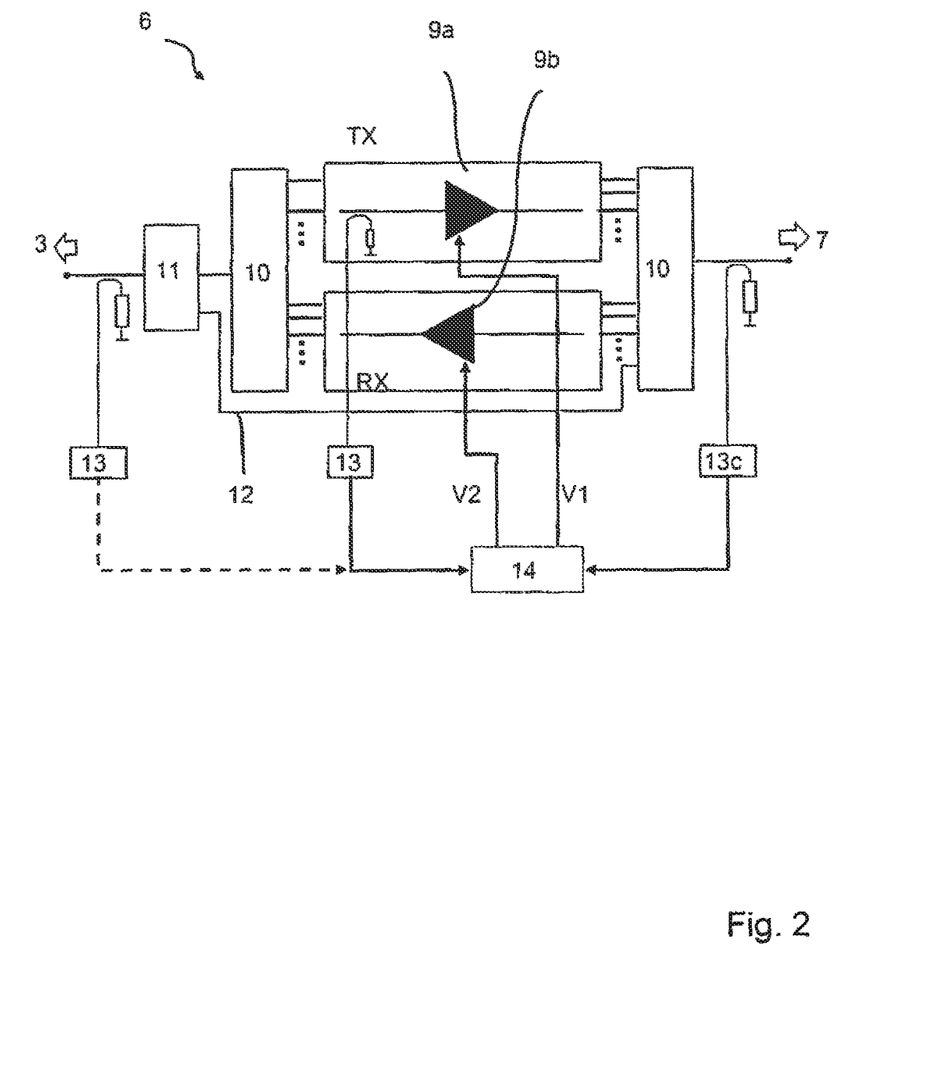
FIG. 2—shows a block diagram of an embodiment of a compensation circuit arrangement.

FIG. 2 shows a block diagram of the compensation circuit arrangement 6. The compensation circuit arrangement 6 has a first antenna signal amplifier 9a for the transmit signal transmitted from the mobile radio terminal 3 to the antenna 7 and a second antenna signal amplifier 9b for the receive signal received via the antenna 7 from the base station 1 and forwarded to the mobile radio terminal 3. To switch between the transmit path TX and the receive path RX of the antenna signal amplifiers 9a, 9b, there are switches and/or filter elements 10. A further switch 11 can be provided for a bypass link 12 in order to pass a signal without further amplification. Like the selection of the number of antenna signal amplifiers 9a, 9b, this is optional possibly separated for individual frequency bands. Thus, separate antenna signal amplifiers can be provided in signal branches provided for this purpose, e.g. for each mobile radio system GSM, CDMA/LTE and possibly for different frequency bands such as, e.g. 800 MHz, 900 MHz, 1800 MHz, 1900 MHz, 2100 MHz and 2600 MHz.

To measure the signal powers, there can be, for example, a first detection unit 13a for the determination of the transmit signal power of the mobile radio terminal occurring there at the input of the compensation circuit arrangement 6 toward the mobile radio terminal 3, a second detection unit 13b on the input side in the transmit path TX for the detection of the active band and a third detection unit 13c at the output of the compensation circuit arrangement 6 toward the antenna 7. By means of these detection units 13a, 13b, 13c, the signal power present there is detected and transferred to a control unit 14. The control unit 14 then determines a respective gain factor V1, V2, by means of which the current coupling attenuation determined by the control unit 14 is compensated for the transmit path TX and the receive path RX. It can be seen that possibly a number of detection units of the first, second and third type, i.e. of the detection units 13a, 13b, 13c can be present for each frequency band provided.

The first, second and/or third detection units 13a, 13b, 13c can be designed for measuring the signal powers in a number of frequency bands but also optionally in each case as one unit for the detection of the signal levels present in selectable frequency bands.

With the aid of the control unit 14, a further adjustment of the gain factor V1, V2 of the at least one associated antenna signal amplifier 9a, 9b is thus superimposed on the control loop mandatorily present in the system, i.e. on the power control on the network side between mobile radio terminal 3 and base station 1. The power control on the network side is determined by an antenna signal power control loop between the connected mobile radio terminal 3 and the base station 1, connected therewith, of a mobile radio network, with which the mobile radio terminal 3 is in communication connection. By means of this power control on the network side, a control of the transmit power of the mobile radio terminal 3 is carried out by the specifications of the communication standard.

The control unit 14 is then configured for the attenuation compensation by suitable programming in the way described in the text which follows.

It is assumed that below a particular limit value $P_{limit}$ for the detected antenna signal power the reception is adequate enough and the primary power control of the mobile radio terminal 3 on the network side, present in any case, ensures operation within a permissible power range. By means of the power control on the network side, a coupling attenuation is thus compensated for automatically and completely.

Figure 3:
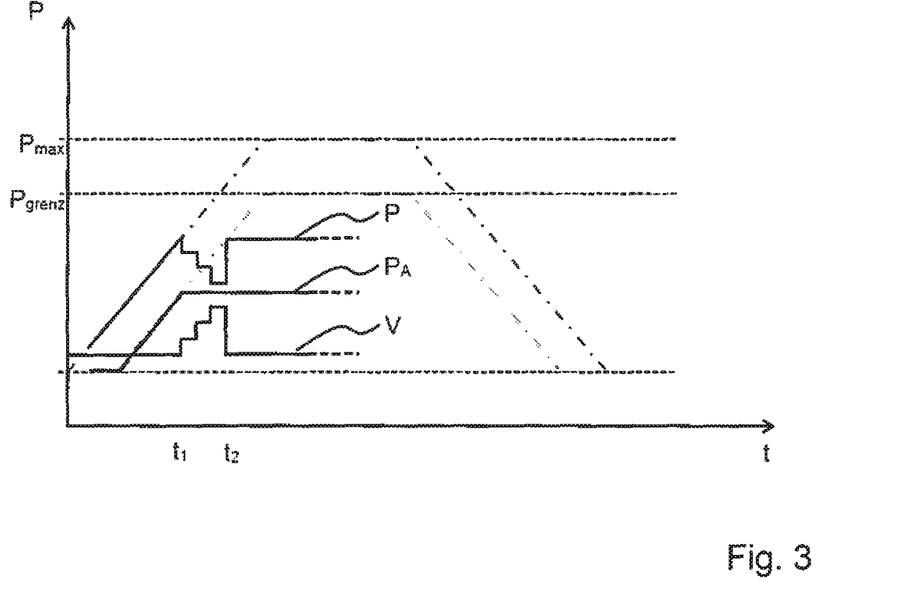
FIG. 3—shows a diagram of the signal powers of the mobile radio terminal and of the antenna signal amplifier and of the gain factor over time in a power range.

This operating range is formed in the diagram in FIG. 3. The signal power P is shown there over time t for the transmit signal power $P_M$ of the mobile radio terminal 3 and the antenna signal power $P_A$ at the output of the compensation circuit arrangement, i.e. the compensator output power. Furthermore, the compensator amplification, i.e. the gain factor V of the antenna signal amplifier is plotted over time t. For this range of adjustment, a minimum gain factor $V_{min}$ is then specified in such a manner that the amplification within an assumed lowest coupling attenuation exactly compensates for it. By means of the dashed continued lines it is indicated that the control unit 14 is optionally configured in such a way that it adjusts the specified minimum gain factor $V_{min}$ when the detected antenna signal power $P_A$ is less than the specified limit value $P_{limit}$. This leads to the transmit power $P_M$ of the mobile radio terminal 3 always lying within the permissible limit up to the predetermined maximum transmit power $P_{max}$.

It can also be seen that the control unit 14 is configured for the test-wise adaptation of the amplification factor V, for example in steps of predetermined attenuation, e.g. In 1 dB steps. Thus, the gain factor V can be increased, e.g. In a number of 1 dB steps following one another. Due to the effective power control on the network side this leads to the transmit power $P_M$ of the mobile radio terminal 3 being correspondingly reduced in order to keep the predetermined antenna signal power $P_A$ constant. In the short measuring and testing time it must be assumed that the environmental influences can be assumed to be virtually constant.

Figure 4:
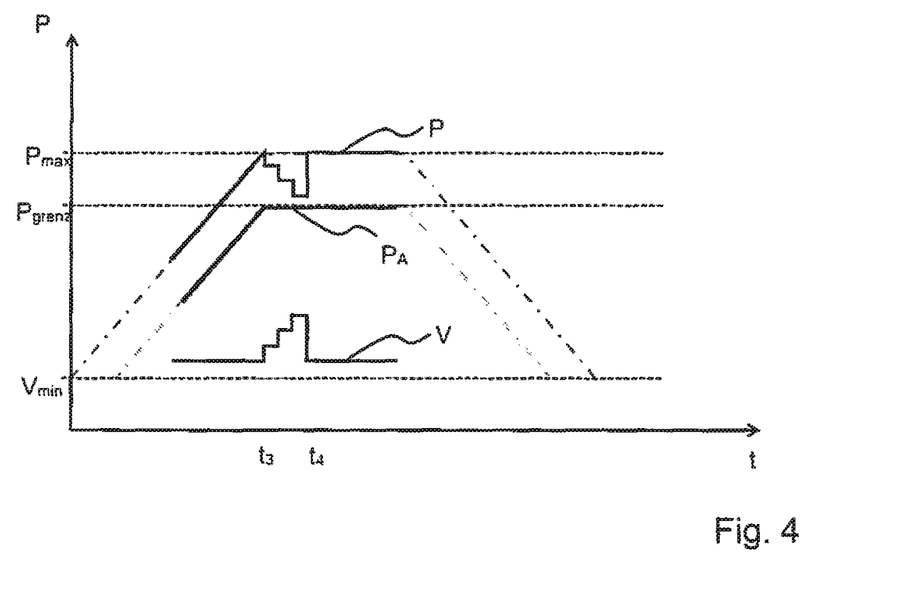
FIG. 4—shows a diagram from FIG. 3 with antenna signal power of the antenna signal amplifier in the saturation range.

In FIG. 4 (limit case) it is clear from the diagram with operation of the mobile radio terminal 3 above the predetermined limit value $P_{limit}$ that the power control on the network side still ensures, when the gain factor V is increased test-wise in the steps in the time interval between t3 and t4 that the antenna signal power $P_A$ is kept constant at the output of the compensation circuit arrangement 6.

Due to a test-wise increase in the gain factor V, for example in a number of steps in succession of one another, a corresponding pattern of the transmit power $P_M$ of the mobile radio terminal 3 can thus be seen in normal operation with operable power control on the network side with which the actual coupling attenuation can still be compensated for completely which is oppositely directed hereto.

Figure 5:
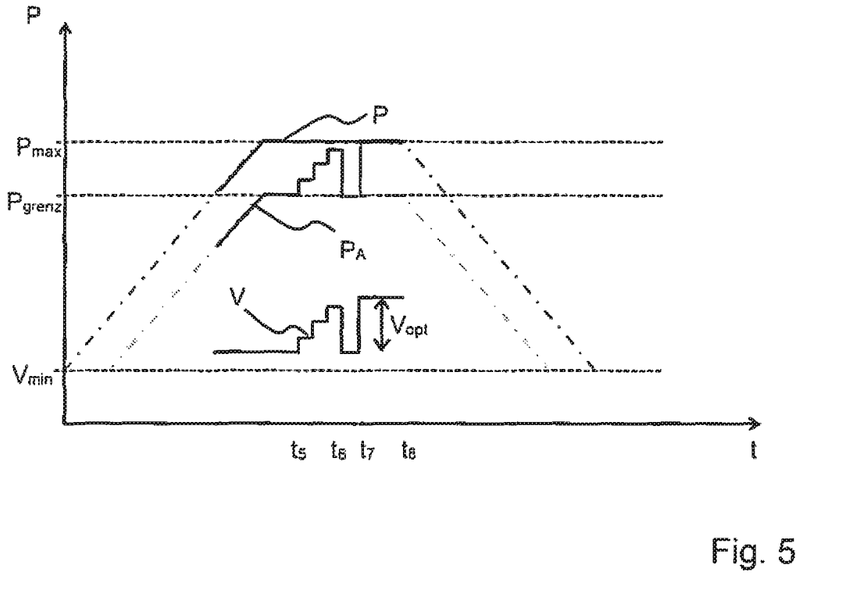
FIG. 5—shows a diagram according to FIGS. 3 and 4 with transmit power of the mobile radio terminal in the saturation range.

FIG. 5 then shows a diagram of the antenna signal power P over time t in which the transmit power $P_M$ of the mobile radio terminal 3 remains constantly on the value of the maximum transmit power $P_{max}$ with a test-wise increase in the gain factor V. This makes it clear that above a certain limit value for the detected antenna signal power P, i.e. with a poorer reception, the power control on the network side gradually changes into the maximum transmit power range $P_{max}$. With the communication according to the LTE standard, this would be the case at 24 dBm. Whereas in a situation according to FIG. 4, the power control on the network side acting with a periodicity of 667 μs (1500 Hz) can act in comparatively greater time intervals with the incremental change of the gain factor V, an unaltered constant value of the transmit power $P_M$ of the mobile radio terminal 3 arises when the maximum transmit power is reached as in FIG. 5. In spite of the increase of the gain factor V, the transmit power $P_M$ of the mobile radio terminal 3 is not yet sufficient for completely compensating for the coupling attenuation. This situation is recognizable not only due to the fact that the transmit power $P_M$ of the mobile radio terminal 3 remains constant in spite of a test-wise increase in the gain factor V. On the output power $P_A$ of the compensation circuit arrangement 6, a corresponding incremental increase is also found which follows the pattern of the test-wise change in the gain factor V directly. Thus, it is not only reaching the maximum transmit power $P_{max}$ via the transmit signal of the mobile radio terminal 3 which can be utilized for recognizing when the mobile radio terminal 3 sends with maximum transmit power in order to be able to then infer the precise coupling attenuation by means of the detected antenna signal power $P_A$. Instead, after finding an unchanged detected antenna signal power $P_A$, the amplification is increased test-wise in steps or, if necessary, reduced and the response of the mobile radio terminal 3 is observed. If it can be seen that the power control on the network side is activated, this is equivalent to a sufficiently good reception with the minimum amplification $V_{min}$ being given and the primary power control on the network side ensures a reliable connection with compensation for the currently existing coupling attenuation.

Should the transmit power $P_M$ of the mobile radio terminal 3 still be constant in spite of a change in the amplification V, it can be assumed that the mobile radio terminal 3 is actually transmitting with maximum transmitting power. The difference between the measured input power value of the circuit arrangement 6 and the maximum transmit power $P_{max}$ of the mobile radio terminal 3 then assumed is caused by the coupling attenuation and cable attenuation. It can be used for adjusting the optimum amplification by means of which a precise compensation would be possible.

This optimum gain factor $V_{opt}$ can be calculated with the aid of this difference or of the quotient or also, however, determined test by test by increasing the gain factor V. The optimum gain factor is then preferably deposited in a data memory of the compensation circuit arrangement 6 and read out of it for driving the antenna signal amplifiers 9a, 9b.

This stored value $V_{opt}$ can then be utilized until the next calculation phase and retained.

Figure 6:
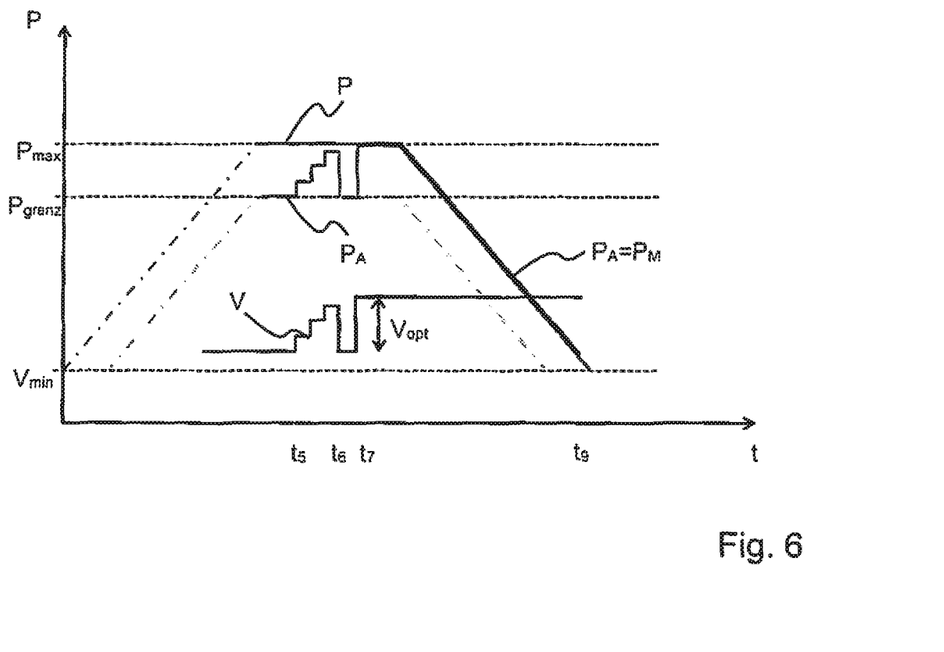
FIG. 6—shows a diagram from FIG. 5 with further utilization of an adapted gain factor.

This is outlined in FIG. 6. It can be seen that as a result, the transmit power $P_M$ of the mobile radio terminal 3 and the antenna signal power $P_A$ at the compensator output are matched since the actual coupling attenuation is almost completely balanced with the optimum gain factor $V_{opt}$. If the coupling attenuation changes, for example by displacement of the mobile radio terminal 3 on the coupling shell 4, the optimum gain factor $V_{opt}$ can be determined, stored and adjusted in the next calculation phase, i.e. when it is detected that the mobile radio terminal 3 is again sending with maximum transmit power $P_{max}$. This ensures that the primary power control on the network side is supported by adaptation of the gain factor V without two control loops acting against one another. In addition, it is ensured that the compensation circuit arrangement 6 adapts an adaptation of the gain factor V to the attenuation actually present in the antenna signal path.

The detection unit 13a, 13b, 13c is preferably implemented with respect to signals in the circuit arrangement 6 in such a manner that the antenna signal power $P_A$ at the output of the circuit arrangement 6 of at least one associated transmit amplifier 9a, which is used for amplifying an antenna signal sent out by the mobile radio terminal 3 is detected. Detection of the antenna signal power $P_A$ as transmit power of the mobile radio terminal 3 has the advantage that this power of the transmit signal is significantly higher than the power of the receive signal in the received path RX. The change of this signal power can be detected from the noise of the antenna signal with a good correlation with the power control of the antenna signal power control loop between mobile radio terminal 3 and base station 1, i.e. detecting the power control on the network side and using it as quantity utilized for adaptation of the gain factor V.

The control unit 14 can then be configured for adapting the gain factor V1 of at least one transmit amplifier 9a which serves for amplifying an antenna signal sent out by the mobile radio terminal 3. An adjustment of at least one associated receive amplifier 9b, which serves for amplifying an antenna signal received via the antenna 7, e.g. from a base station 1, can then take place in dependence on the adapted gain factor V1 of the associated transmit amplifier 9a. The gain factor V2 for the receive amplifier 9b is thus specified, e.g. proportionally with a specified factor to the gain factor V1. The adaptation of the gain V of the compensator thus occurs preferably on the basis of the transmit signal of a connected mobile radio terminal 3. This adapted gain factor V1 is then utilized directly or proportionally to the adjustment of the receive gain factor V2.

With the aid of the recognition of the response to a change of the gain factor in the antenna signal power, it can be ensured in a simple manner that the actual coupling attenuation can be compensated for optimally and it is ensured that with a maximum transmit power of the mobile radio terminal 3 the antenna signal power $P_A$ does not exceed a predetermined upper limit value $P_{max}$ at the antenna foot point.

The invention claimed is:

1. A circuit arrangement for compensating for an attenuation occurring in an antenna signal link between a mobile radio terminal and an antenna, comprising:
    at least one antenna signal amplifier in the antenna signal link for amplifying or attenuating an antenna signal;
    a control unit associated with said at least one antenna amplifier for adjusting a gain factor by which the antenna signal conducted through the at least one signal amplifier is amplified or attenuated; and
    at least one detection unit for detecting an antenna signal power of the antenna signal in a signal path of the antenna signal link, wherein
    the control unit is configured
        for changing the gain factor incrementally in predetermined variables of the gain factor by way of a test to provide a corresponding pattern,
        for detecting a change, following as response to the test-wise change of the gain factor, of antenna signal power caused by a change of transmit power of a mobile radio terminal, and
        for adapting the gain factor to a coupling attenuation of the antenna signal link in dependence on the corresponding pattern of a detected response of the mobile radio terminal.

2. The circuit arrangement according to claim 1, wherein the control unit is configured for a further increase in the gain factor if, by detecting the antenna signal power, no change of the transmit signal power of the mobile radio terminal as response to a test-wise increase in the gain factor is detected.

3. The circuit arrangement according to claim 1, wherein the control unit is configured for adjusting a predetermined minimum gain factor if the detected antenna signal power is less than a predetermined threshold value.

4. The circuit arrangement according to claim 1, wherein the control unit is configured for adjusting a predetermined minimum gain factor when a change in the detected signal power is detected.

5. The circuit arrangement according to claim 1, wherein the control unit is configured for adjusting a predetermined minimum gain factor when the detected antenna signal power is less than a predetermined second threshold value after the first determination of an optimal gain factor.

6. The circuit arrangement according to claim 1, wherein the control unit is configured for evaluating the form of the antenna signal power detected with the at least one detection unit in response to a sequence of test-wise changes of the gain factor.

7. The circuit arrangement according to claim 1, wherein the control unit is configured for changing the gain factor in a phase in which the detected transmit signal power of the mobile radio terminal is constant, to a gain factor suitable for compensating for a difference of the antenna signal power detected during a process of the antenna signal amplifier and the transmit signal power of the mobile radio terminal.

8. The circuit arrangement according to claim 1, wherein the control unit is configured for the detection of antenna signal power received via an antenna from the control unit or radiated via the antenna for an incremental change of the gain factor in a phase in which the detected antenna signal power is constant, and the control unit is configured for determining the coupling attenuation in dependence on the detected antenna signal power when the incremental change of the gain factor does not lead to a change of the detected antenna signal power.

9. The circuit arrangement according to claim 1, wherein the circuit arrangement includes a data memory for storing an adapted gain factor and a predetermined minimal gain factor.

10. The circuit arrangement according to claim 1, wherein the control unit is configured for adjusting the antenna signal amplifier with an adapted gain factor for as long until a maximum transmit signal power of a mobile radio terminal is detected, and on detection of an operation at maximum transmit signal power of the mobile radio terminal a new adaptation of the gain factor takes place.

11. A method for compensating for an attenuation occurring in an antenna signal link between a mobile radio terminal and an antenna with the aid of at least one signal amplifier in the antenna signal link comprising the steps:

detecting an antenna signal power of the antenna signal in the signal path of the antenna signal link,     changing a gain factor incrementally in predetermined variables of the gain factor by way of a test to provide a corresponding pattern,     detecting if the antenna signal power changes in response to the test-wise change of the gain factor due to a power control of the mobile radio terminal, and     adapting the gain factor to the coupling attenuation of the antenna signal link in dependence on the corresponding pattern of a detected change in the antenna signal power as a response of the power control of the mobile radio terminal.

12. The method according to claim 11, further comprising a further increase or further decrease of the gain factor when, due to detection of the antenna signal power, no change of the transmit signal power of the mobile radio terminal as a response to a test-wise increase in the gain factor is detected.

13. The method according to claim 11, further comprising the step of adjusting a predetermined minimum gain factor when the detected antenna signal power is less than a predetermined threshold value or when a change of the received transmit power is detected.

14. The method according to claim 11, further comprising evaluating a form of the antenna signal power which is obtained as a response to a sequence of test-wise changes of the gain factor.

15. The method according to claim 11, further comprising the step of incrementally changing the gain factor and retaining of the gain factor over a time interval which is greater than the control time of a power control of the mobile radio terminal through control signals of a base station.

16. The method according to claim 11, further comprising changing the gain factor in a phase in which the detected transmit signal power of the mobile radio terminal is constant to a gain factor suitable for compensating for the difference of antenna signal power detected during a process of the antenna signal amplifier and the transmit power of the mobile radio terminal.

17. The method according to claim 11, further comprising the steps of:

detecting the antenna signal power received via the antenna or radiated via the antenna,         incrementally changing of the gain factor in a phase in which the detected antenna signal power is constant, and         determining a coupling attenuation in dependence on the detected antenna signal power when the incremental change of the gain factor does not lead to a change in the detected antenna signal power.

18. A circuit arrangement for compensating for an attenuation occurring in an antenna signal link between a mobile radio terminal and an antenna, comprising:

at least one antenna signal amplifier in the antenna signal link for amplifying or attenuating an antenna signal;

a control unit associated with said at least one antenna amplifier for adjusting a gain factor by which the antenna signal conducted through the at least one signal amplifier is amplified or attenuated; and     at least one detection unit for detecting an antenna signal power of the antenna signal in a signal path of the antenna signal link, wherein     the control unit is configured         for changing the gain factor by way of a test,         for detecting a change, following as response to the test-wise change of the gain factor, of antenna signal power caused by a change of transmit power of a mobile radio terminal,         for resetting the gain factor after the test-wise change of the gain factor to the value of the gain factor being adjusted just before performing the change of the gain factor by way of a test, and         for adapting the gain factor to a coupling attenuation of the antenna signal link in dependence on a detected response of the mobile radio terminal.

19. A method for compensating for an attenuation occurring in an antenna signal link between a mobile radio terminal and an antenna with the aid of at least one signal amplifier in the antenna signal link comprising the steps:

detecting an antenna signal power of the antenna signal in the signal path of the antenna signal link,     changing a gain factor by way of a test,     detecting if the antenna signal power changes in response to the test-wise change of the gain factor due to a power control of the mobile radio terminal,     resetting the gain factor after the test-wise change of the gain factor to the value of the gain factor being adjusted just before performing the change of the gain factor by way of a test, and     adapting the gain factor to the coupling attenuation of the antenna signal link in dependence on a detected change in the antenna signal power as a response of the power control of the mobile radio terminal.

20. A circuit arrangement for compensating for an attenuation occurring in an antenna signal link between a mobile radio terminal and an antenna, comprising:

at least one antenna signal amplifier in the antenna signal link for amplifying or attenuating an antenna signal;

a control unit associated with said at least one antenna amplifier for adjusting a gain factor by which the antenna signal conducted through the at least one signal amplifier is amplified or attenuated; and     at least one detection unit for detecting an antenna signal power of the antenna signal in a signal path of the antenna signal link, wherein     the control unit is configured         for changing the gain factor by way of a test,         for detecting a change, following as response to the test-wise change of the gain factor, of antenna signal power caused by a change of transmit power of a mobile radio terminal, and         for adapting the gain factor to a coupling attenuation of the antenna signal link in dependence on a detected response of the mobile radio terminal,         wherein the control unit is configured to decide by means of the resultant response to the test-wise changing of the gain factor either due to a starting power control of the mobile radio terminal or by absence of the power control of the mobile radio terminal whether and to what extent the gain factor is adapted.

21. A method for compensating for an attenuation occurring in an antenna signal link between a mobile radio terminal and an antenna with the aid of at least one signal amplifier in the antenna signal link comprising the steps:

detecting an antenna signal power of the antenna signal in the signal path of the antenna signal link,     changing a gain factor by way of a test,     detecting if the antenna signal power changes in response to the test-wise change of the gain factor due to a power control of the mobile radio terminal, deciding by means of the resultant response to the testwise changing of the gain factor either due to a starting power control of the mobile radio terminal or by absence of the power control of the mobile radio terminal whether and to what extent the gain factor is adapted, and adapting the gain factor to the coupling attenuation of the antenna signal link in dependence on a detected change in the antenna signal power as a response of the power control of the mobile radio terminal.

* * * * *